(12) United States Patent
Ishiwaki (10) Patent No.: US 6,661,864 B2
(45) Date of Patent: Dec. 9, 2003

(54) COUNTER CIRCUIT FOR DETECTING ERRONEOUS OPERATION AND RECOVERING TO NORMAL OPERATION BY ITSELF

(75) Inventor: Masahiko Ishiwaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/929,119

(22) Filed: Aug. 15, 2001

(65) Prior Publication Data

US 2002/0114422 A1 Aug. 22, 2002

(30) Foreign Application Priority Data

Feb. 16, 2001 (JP) ........................................ 2001-040020

(51) Int. Cl.$^7$ ............................................... H03K 21/40
(52) U.S. Cl. .............................. 377/28; 377/30; 377/46; 377/116
(58) Field of Search ............................ 377/28, 30, 116, 377/46

(56) References Cited

U.S. PATENT DOCUMENTS 5,077,764 A * 12/1991 Yamashita .................. 377/116
5,754,615 A * 5/1998 Colavin ...................... 377/47

FOREIGN PATENT DOCUMENTS

JP    8-162946    6/1996

* cited by examiner

Primary Examiner—Margaret R. Wambach
(74) Attorney, Agent, or Firm—McDermott, Will & Emery (57) ABSTRACT

A counter circuit includes a plurality of flip flop circuits (FF circuits) sequentially connected for receiving a common clock signal, and two-input logic gates each having an input connected to an output of a corresponding FF circuit and the other input connected to an output of a common FF circuit, and of which output signal is supplied to an FF circuit positioned at the post stage of the corresponding FF circuit. A booby trap is realized by the two-input logic gates. The value input to each of the FF circuits is determined by logical operation of at most two logical values, so that the counter circuit can be adapted to the increasing frequency of a clock signal CLK. Thus, the counter circuit with the booby trap, capable of performing high-speed operation can be provided.

11 Claims, 8 Drawing Sheets

(REPETITION OF COUNTING)

FIG.3

| CYCLE | m | m+1 | m+2 | m+3 | m+4 | m+5 | m+6 | m+7 | m+8 | m+9 | m+10 | m+11 |
|---|---|---|---|---|---|---|---|---|---|---|---|---|
| X5 | 1 | A | B | 0 | 0 | 0 | /A*/B | /B | 1 | A+B | B | 0 |
| X4 | A | B | 0 | 0 | 0 | /A*/B | /B | 1 | A+B | B | 0 | 0 |
| X3 | B | 0 | 0 | 0 | /A*/B | /B | 1 | A+B | B | 0 | 0 | 0 |
| X2 | C | 0 | 0 | /A*/B | /B | 1 | 1 | A+B | B | 0 | 0 | /A*/B |
| X1 | D | 0 | /A | /B | 1 | 1 | 1 | A+B | B | 0 | /A*/B | /B |

(REPETITION OF COUNTING)

(REPETITION OF COUNTING)

FIG.10

| CYCLE | m | m+1 | m+2 | m+3 | m+4 | m+5 | m+6 | m+7 | m+8 |
|---|---|---|---|---|---|---|---|---|---|
| X5 | 1 | A | 0 | 0 | 0 | 0 | /A | 1 | A |
| X4 | A | 0 | 0 | 0 | 0 | /A | 1 | A | 0 |
| X3 | B | 0 | 0 | 0 | /A | 1 | 1 | A | 0 |
| X2 | C | 0 | 0 | /A | 1 | 1 | 1 | A | 0 |
| X1 | D | 0 | /A | 1 | 1 | 1 | 1 | A | 0 |

(REPETITION OF COUNTING)

(REPETITION OF COUNTING)

| CYCLE | 0 | 1 | ⋯ | N | N+1 | N+2 | ⋯ | 2N-m | 2N-m+1 |
|---|---|---|---|---|---|---|---|---|---|
| CLK | ⊓⊔ | ⊓⊔ | ⋯ | ⊓⊔ | ⊓⊔ | ⊓⊔ | ⋯ | ⊓⊔ | ⊓⊔ |
| X5 | 0 | 0 | ⋯ | 1 | 1 | 1 | ⋯ | 1 | 0 |
| X4 | 0 | 0 | ⋯ | 1 | 1 | 1 | ⋯ | 0 | 0 |
| ⋮ | · | · | ⋯ | · | | | ⋯ | · | · |
| X(m+3) | 0 | 0 | ⋯ | 1 | 1 | 1 | ⋯ | 0 | 0 |
| X(m+2) | 0 | 0 | ⋯ | 1 | 1 | 0 | ⋯ | 0 | 0 |
| X(m+1) | 0 | 0 | ⋯ | 1 | 0 | 0 | ⋯ | 0 | 0 |
| ⋮ | · | · | ⋯ | · | · | | ⋯ | · | · |
| X2 | 0 | 0 | ⋯ | 1 | 0 | 0 | ⋯ | 0 | 0 |
| X1 | 0 | 1 | ⋯ | 1 | 0 | 0 | ⋯ | 0 | 0 |

(REPETITION OF COUNTING)

COUNTER CIRCUIT FOR DETECTING ERRONEOUS OPERATION AND RECOVERING TO NORMAL OPERATION BY ITSELF

BACKGROUND OF THE INVENTION

1. Field of the Invention

The present invention relates to a counter circuit with what is called a booby trap.

2. Description of the Background Art

One of circuits often used in a semiconductor integrated circuit is a Johnson counter. The Johnson counter has a configuration in which a plurality of flip flop circuits (hereinbelow, FF circuits) are connected in series and an output of the FF circuit at the final stage is input to the FF circuit at the first stage. Due to an influence of radiation from the space or the like, however, there is a case such that a value to be held by an arbitrary FF circuit is erroneously inverted. At this time, the counter outputs a value which is not inherently outputted, and an erroneous operation occurs. The Johnson counter having the function of recovering to a normal state by continuously operating even when the erroneous operation occurs is known. The function is generally called a booby trap.

Figure 16:
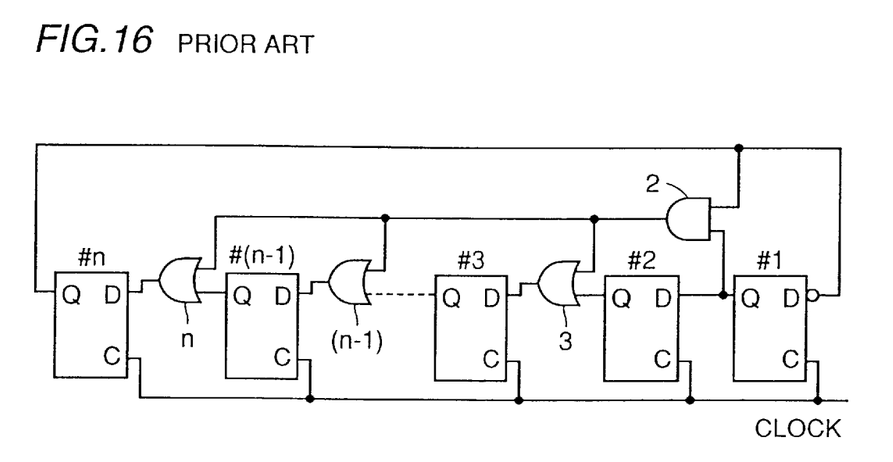
FIG. 16 is a circuit configuration diagram of a counter circuit according to a conventional technique.

FIG. 16 shows a conventional Johnson counter with the booby trap. This is the same as that disclosed in FIG. 5 of publication of Japanese Patent Laying-Open No. 8-162946, and the booby trap is realized by one AND gate 2 and (n−2) OR gates 3 to n.

In the Johnson counter, a common clock signal is input to (n) FF circuits. Each of the FF circuits captures a logical value supplied at the timing of the rising edge of a waveform of a clock signal and holds and continuously outputs the logical value until the next rising edge of the clock signal. On the other hand, the logical value to be held next has to be determined and supplied to each of the FF circuits by the next rising edge of the clock signal.

The frequency of the clock signal is dramatically increasing as the processing speed of a circuit is becoming higher in recent years. In consideration of the circumstances, the logical value to be held next is requested to be supplied to the FF circuit as quickly as possible. In the Johnson counter shown in FIG. 16, however, particularly the value to be supplied to each of FF circuits #3 to #n is obtained by calculating the AND logic of outputs of the FF circuits #1 and #n by the AND logic gate 2 and subsequently computing the OR logic between the AND logic and an output of the FF circuit at the immediately preceding stage by each of the OR logic gates 3 to n. Signal propagation by the AND logic gate 2 and the OR logic gates 3 to n causes a delay in determination of a value to be input to each of the FF circuits. In other words, the AND gate 2 and the OR gates 3 to n provided for realizing a booby trap make designing of a counter circuit requiring high-speed operation difficult.

SUMMARY OF THE INVENTION

It is an object of the present invention to provide a counter circuit capable of operating at high speed.

The invention is, in short, directed to a counter circuit for counting clock signals, which has a plurality of counter stages cascaded for receiving common clock signals.

Each of the plurality of counter stages includes a flip flop circuit for capturing an input signal synchronously with the clock signal, and outputting an output signal according to the captured input signal.

At least one of the plurality of counter stages is a first arithmetic counter stage. The first arithmetic counter stage further includes a first two-input logic gate for receiving, as a first internal input signal, an output of the flip flop circuit included by the first arithmetic counter stage, receiving, as a second internal input signal, an output of the flip flop circuit included by a predetermined counter stage different from the first arithmetic counter stage in the plurality of counter stages, and outputting a result of logical operation of the first and second internal input signals to a counter stage at the post-stage of the first arithmetic counter stage.

Thus, a main advantage of the invention is that by employing a logic gate of two inputs, delay in signal input to a flip flop circuit can be reduced, and high speed operation can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described hereinbelow with reference to the drawings. In the drawings, the same reference numeral denotes the same or corresponding component.

First Embodiment

Figure 1:
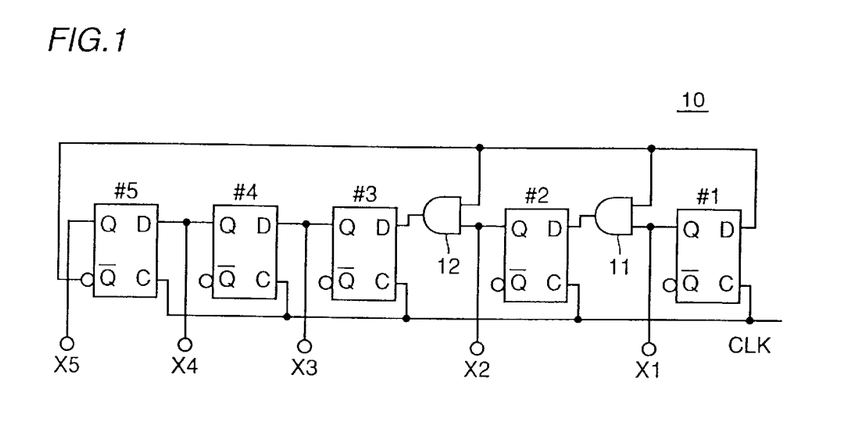
FIG. 1 is a circuit configuration diagram of a counter circuit according to a first embodiment of the invention.

FIG. 1 shows the configuration of a counter circuit according to a first embodiment. A counter circuit 10 includes five flip flop circuits (hereinbelow, referred to as FF circuits) #1 to #5 and two-input AND logic gates 11 and 12. The FF circuits #1 to #5 are sequentially connected in accordance with the order from the FF circuit #1 at the first stage to the FF circuit #5 at the last stage. Each of the FF circuits #1 to #5 has an input terminal D for receiving an input signal, a clock terminal C for receiving a clock signal, an output terminal Q for outputting a logical value held, and an output terminal Q bar (hereinbelow, "Q bar" is simply described as /Q) for outputting an inversion logical value of the held logical value. Each of the AND logic gates 11 and 12 is connected between two FF circuits determined for realizing the booby trap.

The AND logic gates 11 and 12 are provided in correspondence with the FF circuits #1 and #2, respectively. The AND logic gate 11 has two input terminals connected to the output terminal /Q of the FF circuit #5 and the output terminal Q of the FF circuit #1, and an output terminal connected to the input terminal D of the FF circuit #2 at the next stage. The AND logic gate 11 computes the AND logic of two logical values supplied, and outputs the computation result to the output terminal.

The AND logic gate 12 has two input terminals connected to the output terminal /Q of the FF circuit #5 and the output terminal Q of the FF circuit #2, and an output terminal connected to the input terminal D of the FF circuit #3 at the next stage. The AND logic gate 12 computes the AND logic of two logical values supplied, and outputs the computation result to the output terminal.

The output terminals Q of the FF circuits #3 and #4 are connected to the input terminals of the FF circuits #4 and #5 at the next stages, respectively. The output terminal /Q of the FF circuit #5 at the final stage is connected to the input terminal D of the FF circuit #1 at the first stage.

Each of the FF circuits #1 to #5 receives a common clock signal CLK by its terminal C. Each of the FF circuits #1 to #5 captures a logical value received by its input terminal D synchronously with the rising edge of the clock signal CLK and holds the logical value.

When values held by the FF circuits #1 to #5 in the n-th cycle of the dock signal CLK are set as X1(n) to X5(n), respectively, the FF circuits #1 to #5 output logical values so as to satisfy the following equations (1) to (5).

$$X5(n+1)=X4(n) \quad (1)$$

$$X4(n+1)=X3(n) \quad (2)$$

$$X3(n+1)=/X5(n)*X2(n) \quad (3)$$

$$X2(n+1)=/X5(n)*X1(n) \quad (4)$$

$$X1(n+1)=/X5(n) \quad (5)$$

Here "A*B" denotes a logical product of A and B and "/A" denotes an inversion value of A. A cycle denotes a period from the rising edge of a clock signal to the next rising edge. The clock "n" denotes the (n+1)th cycle from the cycle 0 as a start point.

The counter circuit 10 counts the cycles of the clock signal CLK in eight cycles. A bit pattern consisting of the logical values X1 to X5 (values outputted from the terminals Q) held by the FF circuits #1 to #5 is used as a count value of the counter circuit 10.

Figure 2:
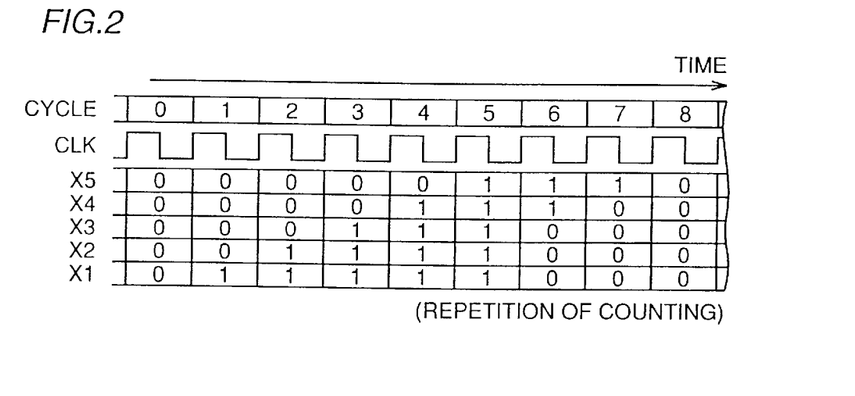
FIG. 2 is a timing chart for explaining counting operation of the counter circuit shown in FIG. 1.

FIG. 2 is a timing chart showing a state where the counter circuit 10 performs the counting operation. It is assumed that all the values X1 to X5 held by the FF circuits #1 to #5 in the cycle 0 are zero.

In the counter circuit according to the first embodiment, as long as the value X5 is "0" in a current cycle, in the following cycle, the value X1 becomes "1" as an inverted value of "0" and the values X2 to X5 become values shifted from the values X1 to X4 in the current cycle. In cycles 0 to 5, therefore, the count value (X5, X4, X3, X2, X1) changes every cycle as (0,0,0,0,0), (0,0,0,0,1), (0,0,0,1,1), (0,0,1,1,1), (0,1,1,1,1) and (1,1,1,1,1).

When the value X5 is "1" in the current cycle, in the following cycle, the value X1 becomes "0" as the inversion value of "1", and the values X4 and X5 become values shifted from the values X3 and X4 in the current cycle. Each of the values X2 and X3 in the next cycle becomes "0" by the AND logic gates 11 and 12. In the cycles 6 and 7, the count value changes every cycle as (1,1,0,0,0) and (1,0,0,0,0), and returns to the original count value (0,0,0,0,0) in the cycle 8. After that, the same counting as that in the cycles 0 to 7 is repeated. The counter circuit 10 therefore outputs eight kinds of count values as normal values.

In the counter circuit 10, a booby trap circuit is realized by the AND logic gates 11 and 12. An operation of recovering to a normal value of the counter circuit 10 in the case where a value which is not included in inherent normal values (hereinbelow, called an abnormal value) is held due to an influence of radiation from the space or the like will be described by using FIG. 3.

Figure 3:
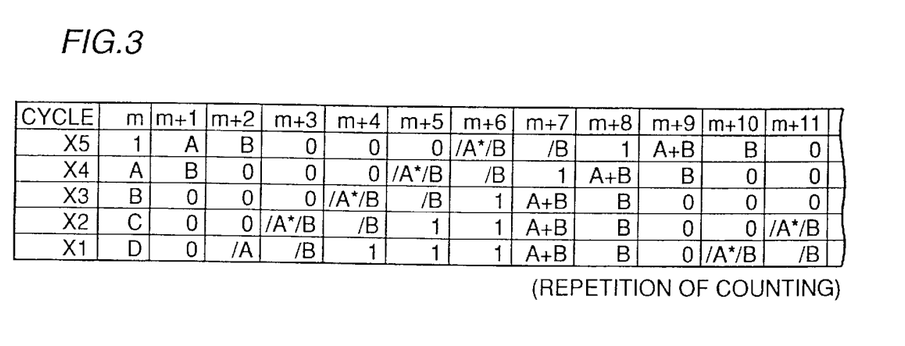
FIG. 3 is a timing chart for explaining a booby trap function of the counter circuit shown in FIG. 1.

When all the count values are zero, the value obtained is a normal value. An abnormal value always includes a bit of "1". In a cycle where an abnormal value is generated or after a few cycles since the cycle, the value X5 of the FF circuit #5 is always "1". The cycle at this point is set as a cycle (m) and it is assumed that the count value of the counter circuit 10 in the cycle (m) is (1,A,B,C,D). Each of A to D is either 0 or 1.

FIG. 3 is an explanatory diagram showing a counting state of the counter circuit 10 in the cycle (m) and subsequent cycles. Since the value X5 is "1" in the cycle (m), all of the values X1 to X3 in the next cycle (m+1) are "0". The values X4 and X5 become logical values held by the FF circuits at the ante-stage in the immediately preceding cycle, that is, "A" and "B", respectively. Since the derivation of the logic values in the following cycles (m+2) and (m+3) is easy, it will not be described.

Although the count value in the cycle (m+3) becomes (0,0,0,/A*/B,/B), this value always coincides with any of the three kinds of normal values in the cycles 0 to 2 in FIG. 2. It means that the count value of the counter 10 is returned to the normal value in the cycle (m+3). In the cycle (m+4) and subsequent cycles, the counter circuit 10 sequentially outputs normal values periodically.

The configuration and operation of the FF circuits #1 to #5 will now be described in detail.

Figure 4:
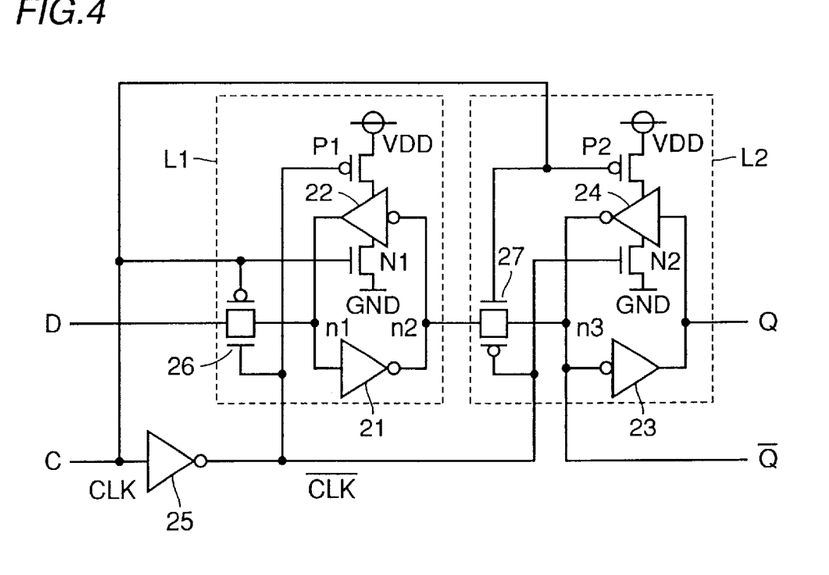
FIG. 4 is a circuit configuration diagram of each of FF circuits provided for the counter circuit shown in FIG. 1.

FIG. 4 is a circuit configuration diagram of each FF circuit. The FF circuit has: a CMOS inverter circuit 21 having an input connected to a node n1 and an output connected to a node n2; a CMOS inverter circuit 22 having an input connected to the node n2 and an output connected to the node n1; a CMOS inverter circuit 23 having an input connected to a node n3 and an output connected to the output terminal Q; a CMOS inverter circuit 24 having an input connected to the output terminal Q and an output connected to the node n3; a CMOS inverter 25 whose input is connected to the clock terminal C; a transfer gate 26 connected between the input terminal D and the node n1; and a transfer gate 27 connected between the nodes n2 and n3.

Each of the inverters 21 to 25 outputs an inverted value of an input logical value. On the basis of the clock signal CLK and an output of the inverter 25, the transfer gate 26 makes the terminal D and the node n1 conductive when the clock signal CLK is at the L level and makes the terminal D and the node n1 non-conductive when the clock signal CLK is at the H level. On the basis of the clock signal CLK and an output of the inverter 25, the transfer gate 27 makes the nodes n2 and n3 conductive when the clock signal CLK is at the H level and makes the nodes n2 and n3 non-conductive when the clock signal CLK is at the L level. That is, the transfer gates 26 and 27 are made conductive and non-conductive so as to be complementary to each other.

The FF circuit further includes: a p-channel MOS transistor P1 for receiving an output of the inverter 25 by its gate terminal and supplying a source voltage VDD to the inverter 22; an n-channel MOS transistor N1 for receiving a clock signal CLK by its gate terminal and supplying the ground voltage GND (0V) to the inverter 22; an n-channel MOS transistor N2 for receiving an output of the inverter 25 by its gate terminal and supplying the ground voltage GND to the inverter 24; and a p-channel MOS transistor P2 for receiving the clock signal CLK by its gate terminal and supplying the source voltage VDD to the inverter 24.

When the clock signal CLK is at the H level, the transistors N1 and P1 are made conductive, thereby supplying the source voltage to the inverter 22 to make the inverter 22 active. When the clock signal CLK is at the L level, the transistors N1 and P1 are non-conductive, so that the inverter 22 does not operate. On the other hand, when the clock signal CLK is at the L level, the transistors N2 and P2 are made conductive, so that the inverter 24 is activated to perform a logic inverting operation. When the clock signal CLK is at the H level, the transistors N2 and P2 are made non-conductive, so that the inverter 22 does not operate. Although not shown, to each of the inverters 21, 23, and 25, the source voltage VDD and the ground voltage GND are always supplied.

The inverters 21 and 22, transfer gate 26, and transistors P1 and N1 construct a latch circuit L1. The inverters 23 and 24, transfer gate 27, and transistors P2 and N2 construct another latch circuit L2. The latch circuit L1 has: a capturing mode in which the transfer gate 26 is turned on to capture an input signal, and the inverter 21 transmits an inversion signal to the node n2; and a retention mode of retaining the captured signal by the two inverter circuits 21 and 22. Similarly, the latch circuit L2 also has: a capturing mode in which the transfer gate 27 is turned on to capture an input signal, and the inverter 23 transmits an inversion signal to the terminal Q; and a retention mode for retaining the captured signal by the two inverter circuits 23 and 24.

The latch circuits L1 and L2 construct what is called a master-slave type flip flop. When the clock signal is at the H level, the latch circuits L1 and L2 are in the retention mode and the capturing mode, respectively. When the clock signal is at the L level, on the contrary, the latch circuits L1 and L2 are in the capturing mode and the retention mode, respectively. By the FF circuit, occurrence of what is called a racing phenomenon of signals can be prevented.

The operation of the FF circuit will be described by using the timing chart of FIG. 5. Particularly, the FF circuit #2 for receiving an output of the AND logic gate 11 in FIG. 1 will be described.

Figure 5:
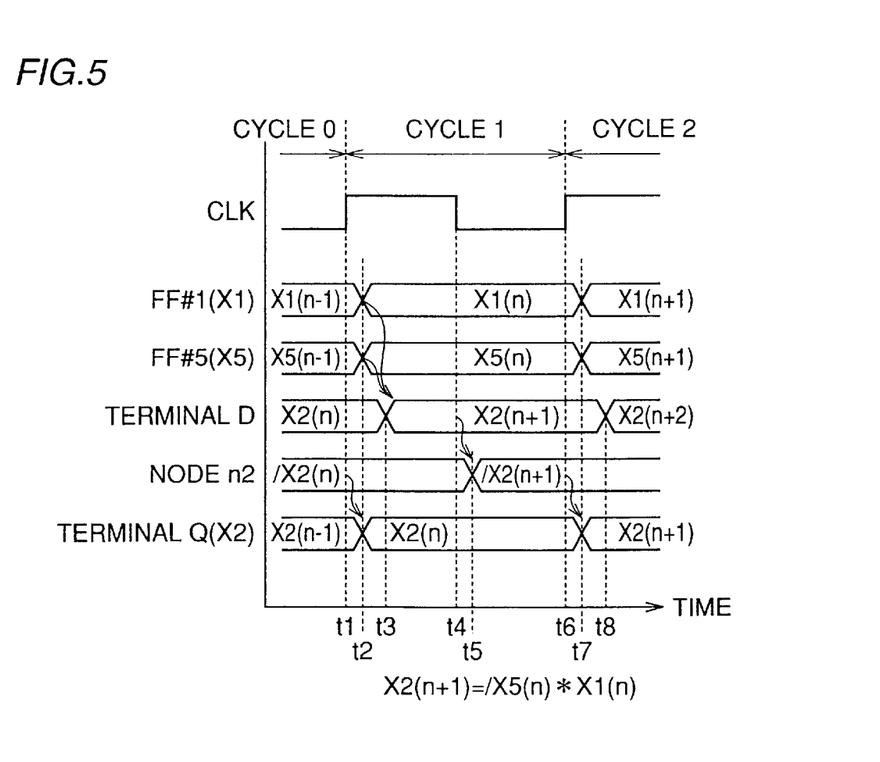
FIG. 5 is a timing chart for explaining the operation of the FF circuit shown in FIG. 4.

Referring to FIG. 5, the terminal D indicates a logical value outputted from the AND logic gate 11. The terminal Q indicates the logical value X2 outputted from the FF circuit #2. FF#1 and FF#5 denote the logical values X1 and X5 outputted from the FF circuits #1 and #5, respectively.

In the cycle 0 before the rising edge of the clock signal CLK at time t1, the FF circuits #1, #2, and #5 output and hold X1(n−1), X2(n−1), and X5(n−1), respectively. The terminal D receives X2(n) as a value supposed to be outputted and held by the FF circuit #2 in the following cycle 1. In the FF circuit #2, since the latch circuit L1 in FIG. 4 is in the capturing mode, the logical value of the node n2 is /X2(n).

In response to the rising edge of the clock signal CLK at the time t1, the latch circuit L1 holds the logical value of the node n2, and the latch circuit L2 outputs X2(n) as an inversion signal of the logical value at the node n2 to the terminal Q at time t2. In the cycle 1, therefore, the FF circuit #2 outputs X2(n) as the value X2.

In response to the rising edge at time t1, the values outputted from the FF circuits #1 and #5 change to X1(n) and X5(n), respectively, at time t2. In response to the change in the values X1 and X5, the output value of the AND logic gate 11 changes to the value X1(n)*/X5(n) at time t3. The value is equal to X2(n+1) as a value to be outputted and held by the FF circuit #2 in the following cycle 2.

At the trailing edge of the clock signal CLK at time t4, the latch circuit L1 captures the logical value X2(n+1) received by the terminal D and outputs the inverted logical value /X2(n+1) to the node n2 at time t5. On the other hand, the latch circuit L2 enters a latch state and holds and continuously outputs the value X2(n) outputted to the terminal Q at time t4.

In response to the rising edge of the clock signal CLK at time t6, the latch circuit L1 holds the logical value of the node n2. At time t7, the latch circuit L2 outputs X2(n+1) as an inversion value of the logical value of the node n2 to the terminal D. In cycle 2, the FF circuit #2 outputs X2(n+1) as the value X2. In response to the rising edge at time t6, values outputted from the FF circuits #1 and #5 change to X1(n+1) and X5(n+1), respectively, at time t7. In response to changes in the values X1 and X5, an output value of the AND logic gate 11 also changes to a value X1(n)*/X5(n). After that, the FF circuit #2 repeats the operation. The FF circuit #3 operates similarly.

The timing at which the value X2(n) changes to the value X2(n+1) in the terminal D has to be before the time t4 at which the trailing edge occurs. For example, in the case where two logical operations are performed and signals are supplied to FF circuits as in the conventional technique, time t3 at which the logic of the signal to be received by the input terminal D changes delays. The higher the frequency of the clock signal is, the more the time t3 becomes close to the time t4, so that it becomes difficult to determine the value input to the terminal D as X(n+1) at time t4. According to the embodiment, however, the changes in outputs of the FF circuits #1 and #5 are propagated to the terminal D only via the AND logic gate 11. Therefore, the timing at which the value changes from X2(n) to X2(n+1) can be generated before the time t4 with allowance. The FF circuit #3 for receiving an output of the AND logic gate 12 is similar to the above. Since the inputs of the FF circuits #1, #4, and #5 are directly influenced by outputs of the FF circuits #5, #3, and #4 at the ante-stage, respectively, a problem does not particularly occur.

Figure 6:
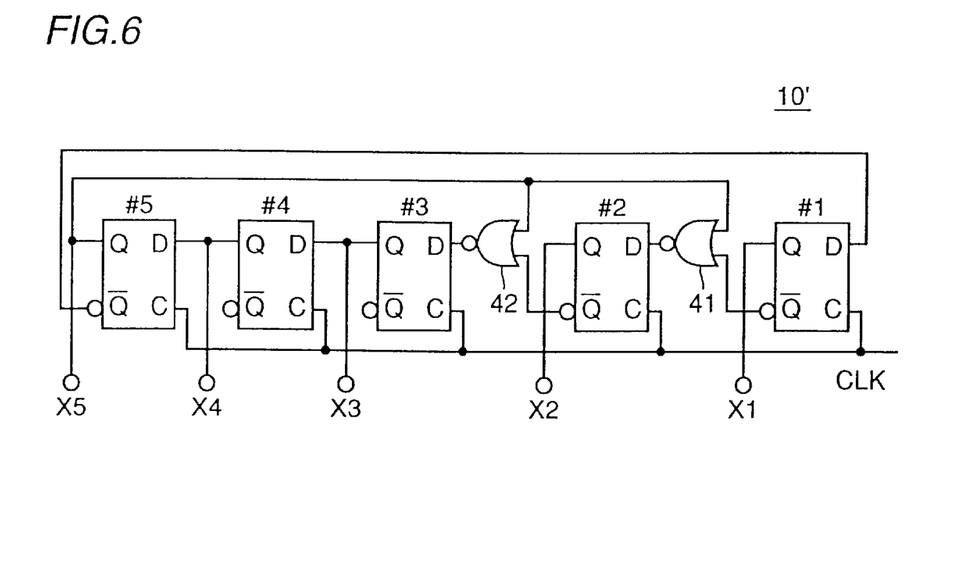
FIG. 6 is a circuit configuration diagram showing a modification of the counter circuit shown in FIG. 1.

The booby trap can be realized, not necessarily by the AND logic gates 11 and 12, but also by using another kind of two-input logic gate. For example, as shown in FIG. 6, when two-input NOR logic gates 41 and 42 are provided in place of the AND logic gates 11 and 12 shown in FIG. 1, the counter circuit 10 performs the same counting operation. The replacement will be easily achieved by using a Boolean algebra. The NOR logic gate 41 has two input terminals to be connected to the terminal Q of the FF circuit #5 and the terminal /Q of the FF circuit #1, and an output terminal to be connected to the terminal D of the FF circuit #2, computes and outputs the NOR logic of two logical values supplied. The NOR logic gate 42 has two input terminals to be connected to the terminal Q of the FF circuit #5 and the terminal /Q of the FF circuit #2, and an output terminal to be connected to the terminal D of the FF circuit #3, and computes and outputs the NOR logic of two input logical values.

As described above, the logic gates for the booby trap are inserted between determined FF circuits. The value received by each of the FF circuits is either the logic value outputted from the FF circuit at the ante-stage or a value obtained by a logical operation of only two logical values outputted from the FF circuit at the ante-stage and a specific FF circuit. Since the value received by each of the FF circuits is determined by the logical operation using at most two logical values, the logical value to be supplied to an FF circuit can be determined quicker as compared with the conventional technique. According to the embodiment, the counter circuit can operate so as to sufficiently follow even a clock signal of high frequency and is therefore suitable for high-speed operation.

Figure 7:
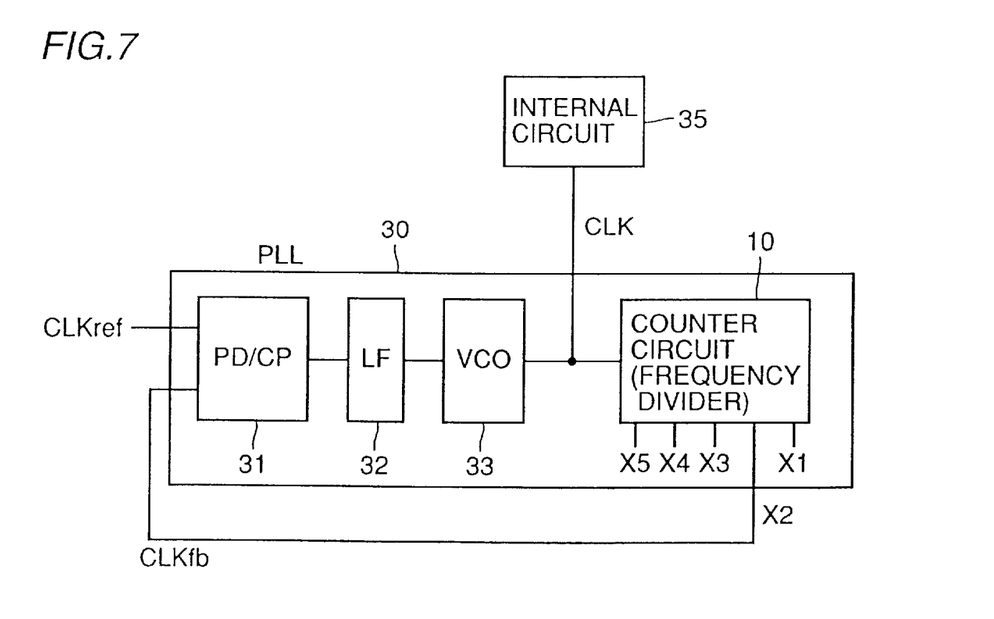
FIG. 7 is a block diagram of a PLL circuit having the counter circuit shown in FIG. 1.

FIG. 7 shows an example in which the counter circuit 10 is applied to a phase locked loop (PLL) circuit.

APLL circuit 30 has a phase comparator 31, a low-pass filter (LF) 32, a voltage controlled oscillator (VCO) 33, and the counter circuit 10 which is the same as that of FIG. 1. The phase comparator 31 compares the phase of a reference clock signal CLKref and that of a clock signal CLKfb and, according to a phase difference, charges/discharges its output node. The LF 32 applies a voltage obtained by eliminating high frequency components of a voltage value at the output node of the phase comparator 31 to the VCO 33. The VCO 33 oscillates the voltage and outputs a clock signal CLK. The frequency of the clock signal CLK is controlled by the voltage value supplied from the LF 32.

The counter circuit 10 is used as a frequency divider and counts the clock signals CLK. A value X2 outputted from the FF circuit #2 in the counter circuit 10 is fed back as the reference clock signal CLKfb to the phase comparator 31. The values X1, X3, X4, and X5 are not used.

It is understood from FIG. 2 that a signal outputted from the FF #2 is equal to a clock signal obtained by dividing the frequency of the clock signal CLK only by eight. When the reference clock signal CLKref has the frequency of 200 MHz, the PLL circuit 30 is locked when the frequency of the clock signal CLKFb becomes equal to that of the reference clock signal CLKref. At the time of the lock, the PLL circuit 30 outputs a clock signal CLK having the frequency of 1.6 GHz which is eight times as high as its frequency. The clock signal CLK is supplied to an internal circuit 35 integrated on the same semiconductor chip on which the PLL circuit is mounted. The internal circuit 35 performs a predetermined operation synchronously with the clock signal CLK. As described above, the counter circuit 10 receives the clock signal as high as 1.6 GHz so that it can be sufficiently applied as a circuit which operates at high speed.

Second Embodiment

Figure 8:
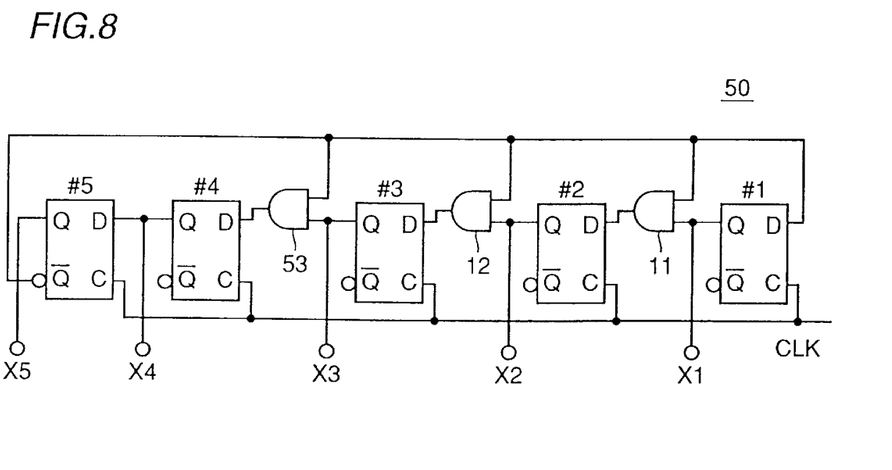
FIG. 8 is a circuit configuration diagram of a counter circuit according to a second embodiment of the invention.

FIG. 8 shows the configuration of a counter circuit 50 according to a second embodiment. The counter circuit 50 includes, in addition to the components of the counter circuit 10 shown in FIG. 1, a two-input AND logic gate 53 provided in correspondence with the FF circuit #3. Except for the AND logic gate 53, the counter circuit 50 has the same configuration as that of the counter circuit 10 shown in FIG. 1. The AND logic gate 53 has two input terminals connected to the output terminal /Q of the FF circuit #5 and the output terminal Q of the FF circuit #3 and an output terminal connected to the input terminal D of the FF circuit #4 at the post stage. The AND logic gate 53 computes the AND logic of two logical values supplied and outputs the computation result to the output terminal. The above-described equation (2) related to X4 is therefore changed to X4(n+1) =X5(n)*X3(n).

Specifically, when a value held by the FF circuit #5 in the current cycle is "0", in the following cycle, the FF circuit #1 retains the inverted value "1" and the FF circuits #2 to #5 retain the values held by the FF circuits #1 to #4 in the current cycle, respectively. When the value retained by the FF circuit #5 is "1" in a certain cycle, in the following cycle, the FF circuits #1 to #4 hold "0" and the FF circuit #5 holds a value shifted from the value retained by the FF circuit #4 at the ante-stage.

On the basis of the operation, the counter circuit 50 counts the cycles of the clock signal CLK in seven cycles.

Figure 9:
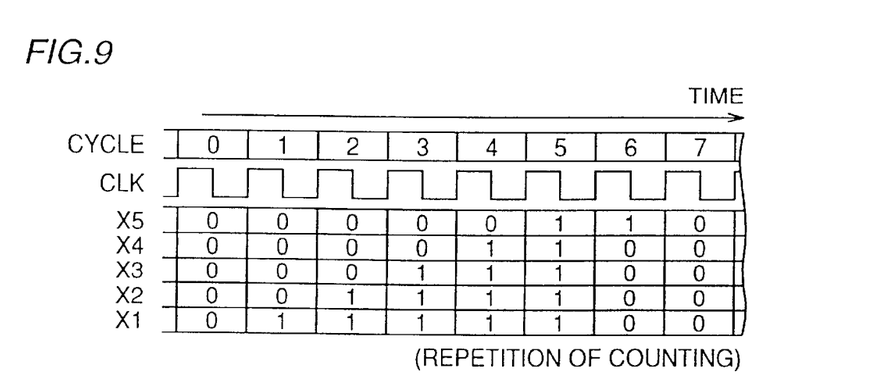
FIG. 9 is a timing chart for explaining the counting operation of the counter circuit shown in FIG. 8.

FIG. 9 is a timing chart showing a state where the counter circuit 10 performs counting operation. When it is assumed that all the values X1 to X5 held by the FF circuits #1 to #5 in cycle 0 are zero, the count value changes every cycle in cycles 0 to 6 as (0,0,0,0,0), (0,0,0,0,1), (0,0,0,1,1), (0,0,1,1,1), (0,1,1,1,1) and (1,1,1,1,1). The count value returns to the original one (0,0,0,0,0) in cycle 7. After that, the same counting as in the cycles 0 to 6 is repeated. In such a manner, the counter circuit 10 outputs seven kinds of count values as normal values.

In the counter circuit 50, a booby trap circuit is realized by the AND logic gates 11, 12 and 53. An operation of recovering to a normal value of the counter circuit 50 in the case where an abnormal value is generated will be described by using FIG. 10.

Figure 10:
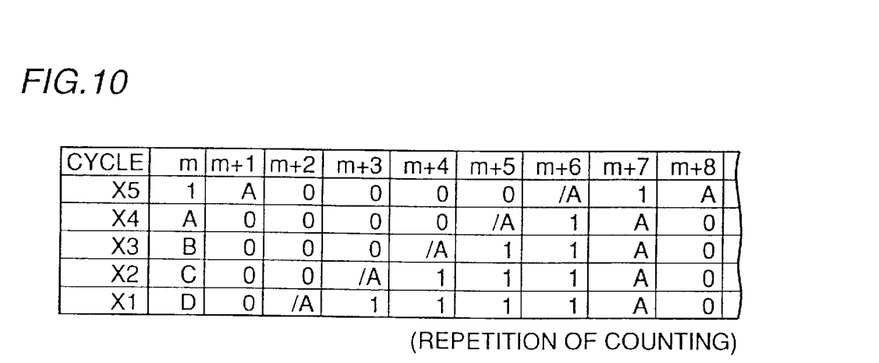
FIG. 10 is a timing chart for explaining a booby trap function of the counter circuit shown in FIG. 8.

For a reason similar to that of the example of FIG. 3, in a cycle where an abnormal value is generated or after a few cycles since the cycle, the value X5 of the FF circuit #5 becomes always "1". It is assumed that the cycle at this point is set as a cycle (m) and the count value (X5,X4,X3,X2,X1) of the counter 10 in the cycle (m) is (1,A,B,C,D). Each of A to D is an arbitrary value of either 0 or 1.

Since the value X5 is 1, in the next cycle (m+1), all the values X1 to X4 are zero and A is retained as the value X5. When A is either 1 or 0, however, the count value in the cycle (m+1) coincides with any one of normals values in the cycles 0 and 6 in FIG. 9. At the time point of the cycle (m+1), the counter circuit 50 recovers to a normal value. After the cycle (m+1), the counter circuit 10 periodically outputs a normal value.

In a manner similar to the first embodiment, a value received by each FF circuit is determined by the logic operation using at most two logical values, so that the counter circuit of the embodiment is also suited for high speed operation. In the first embodiment, the counter circuit with the booby trap circuit has even-number cycles. In contrast, in the second embodiment, the counter circuit having odd-number cycles is obtained. By changing the number of AND logic gates inserted between FF circuits, the cycle can be changed.

Third Embodiment

Figure 11:
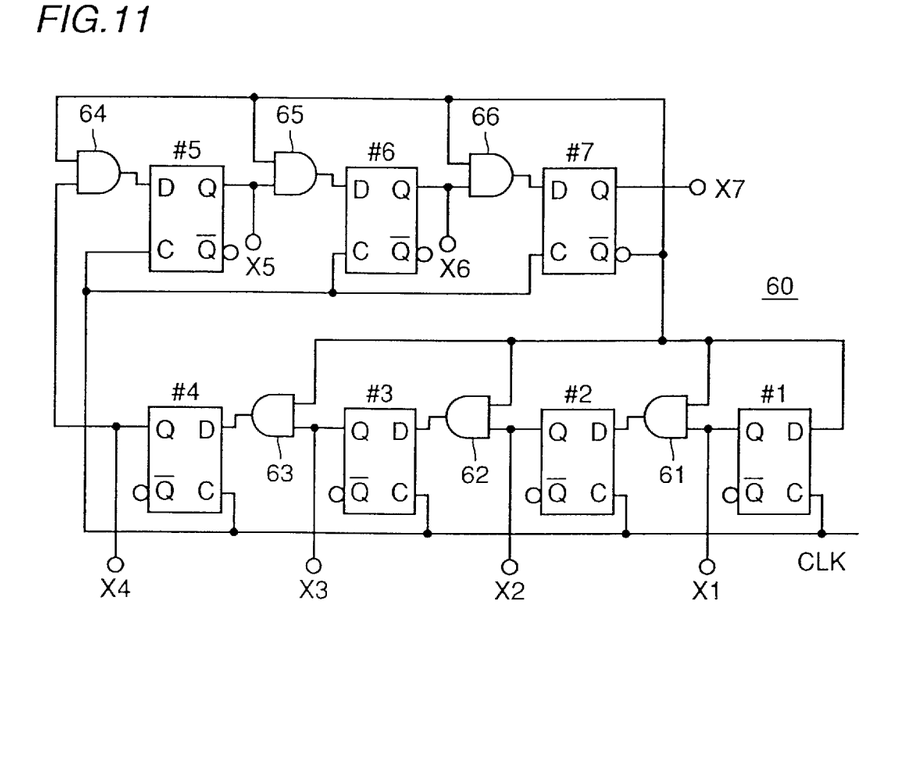
FIG. 11 is a circuit configuration diagram of a counter circuit according to a third embodiment of the invention.

FIG. 11 shows the configuration of a counter circuit 60 according to a third embodiment. The counter circuit 60 includes seven FF circuits #1 to #7 which are sequentially connected and receive the common clock signal CLK by their terminals C and six AND logic gates 61 to 66 provided in correspondence with the FF circuits #1 to #6. Each FF circuit is constructed in a manner similar to FIG. 4.

Each of the AND logic gates 61 to 66 has a first input terminal connected to the output terminal /Q of the FF circuit

7, a second input terminal connected to the output terminal Q of the corresponding FF circuit, and an output terminal connected to the input terminal D of an FF circuit positioned at the post stage of a corresponding FF circuit. Each of the AND logic gates 61 to 66 computes the AND logic of two logical values input to its first and second input terminals and outputs the computation result to its output terminal. A signal outputted from the output terminal /Q of the FF circuit #7 at the final stage of the sequentially connected FF circuits is input to the input terminal D of the FF circuit #1 at the first stage.

In the counter circuit 60, as long as the value retained by the FF circuit #7 in the current cycle is "0", in the following cycle, the FF circuit #1 holds the inverted value "1" and the FF circuits #2 to #7 retain values held by the FF circuits #1 to #6 in the current cycle, respectively. When the value retained by the FF circuit #7 is "1" in a certain cycle, in the following cycle, all the FF circuits #1 to #7 retain "0".

Figure 12:
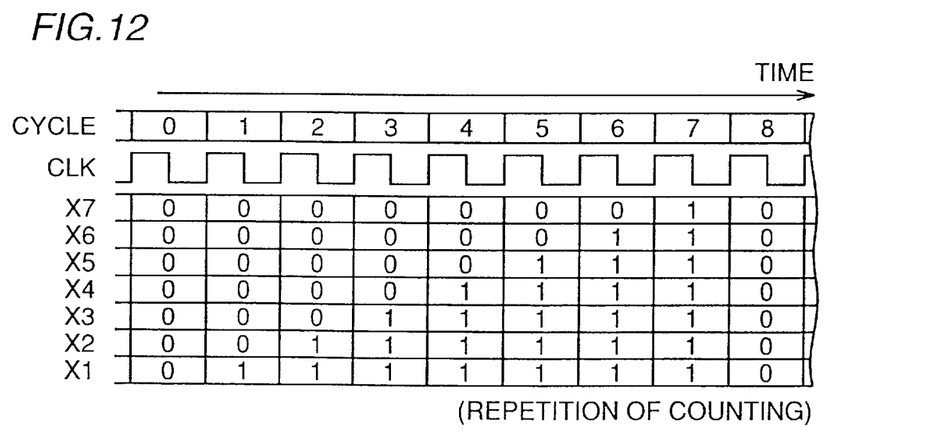
FIG. 12 is a timing chart for explaining the counting operation of the counter circuit shown in FIG. 11.

On the basis of the operation, the counter circuit 60 counts the number of cycles of the clock signal CLK in eight cycles. FIG. 12 is a timing chart showing a state where the counter circuit 10 performs counting operation. When it is assumed that all of values X1 to X7 held by the FF circuits #1 to #7 in cycle 0 are zero, the count value changes every cycle in cycles 0 to 7 as (0,0,0,0,0,0,0), (0,0,0,0,0,0,1), (0,0,0,0,0,1,1), (0,0,0,0,1,1,1), (0,0,0,1,1,1,1), (0,0,1,1,1,1,1), (0,1,1,1,1,1,1), and (1,1,1,1,1,1,1). The count value returns to the original one (0,0,0,0,0,0,0) in the next cycle 8. After that, the same counting operation as that in the cycles 0 to 7 is repeated.

In the counter circuit 60 as well, even if an abnormal value is generated, the counter circuit 60 can recover to a normal value. For a reason similar to that in the example of FIG. 3, in a cycle where the abnormal value is generated or after a few cycles of the cycle, the value X7 held by the FF circuit #7 becomes always 1. In the following cycle, all of the FF circuits hold zero and recover to the normal values.

In the third embodiment as well, in a manner similar to the first embodiment, a value received by each FF circuit is determined by the logic operation using at most two logical values. Thus, the counter circuit of the third embodiment is also suited for high-speed operation.

According to the embodiment, the counter circuit for performing the counting operation in the same cycles as those of the first embodiment is provided. In the case where the counter circuit holds an abnormal value, it is devised so that the time required to recover to the normal value becomes shorter as compared with the first embodiment. In the first embodiment, as understood from FIG. 3, the FF circuit #5 whose output signal is commonly supplied to a plurality of AND logic gates holds "1" and recovers to the normal value after three cycles at the maximum. In contrast, in the third embodiment, as described above, by providing (N−1) AND logic gates for the (N) FF circuits, the FF circuit #7 recovers to a normal value already in the cycle subsequent to the cycle where the FF circuit #7 holds "1".

Fourth Embodiment

Figure 13:
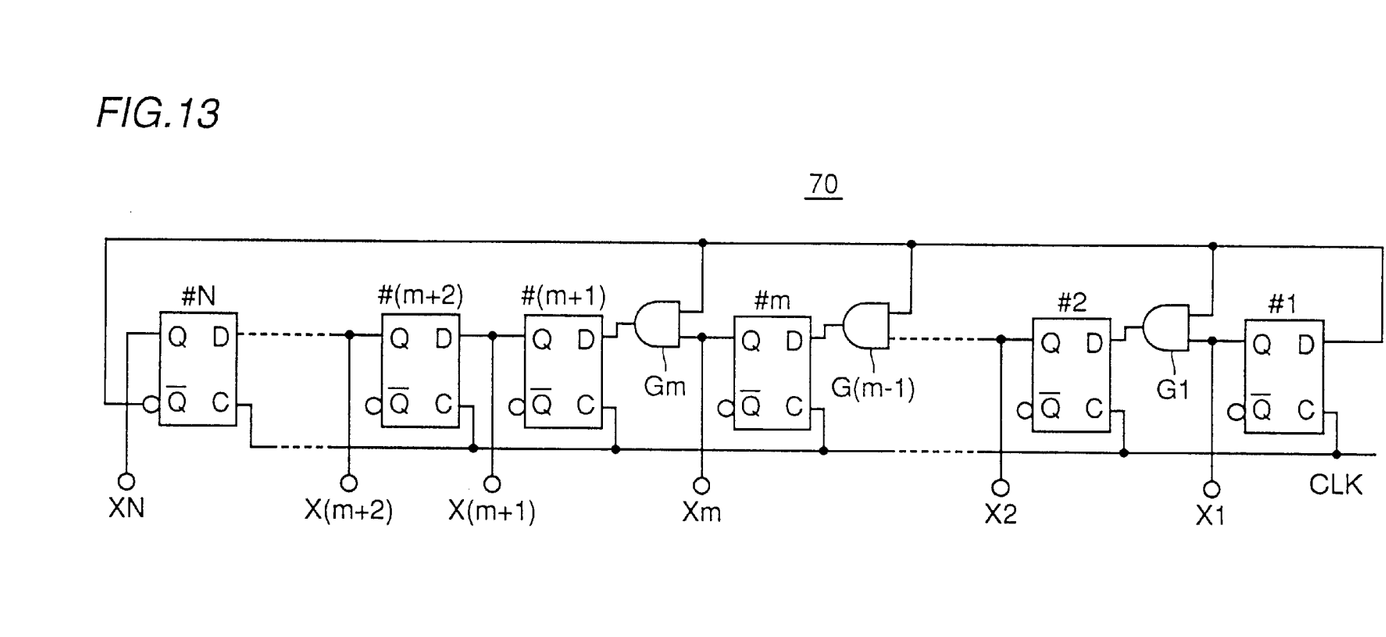
FIG. 13 is a circuit configuration diagram of a counter circuit according to a fourth embodiment of the invention.

FIG. 13 shows the configuration of a counter circuit 70 according to a fourth embodiment. The counter circuit 70 includes (N) FF circuits and (m) two-input AND logic gates. The FF circuits #1 to #N are sequentially connected starting from the FF circuit #1 at the first stage to the FF circuit #N at the final stage, and receive the same clock signal CLK by their terminals C. The two-input AND logic is connected between two FF circuits separately determined to realize a booby trap. In this case, N is an integer equal to or larger than 2, and m is an integer in a range from 1 to (N−1). Since each of the FF circuits #1 to #N has a configuration similar to that of FIG. 4, its description will not be repeated.

AND logic gates G1 to Gm are provided in correspondence with one or more FF circuits #1 to #m. Each of the AND logic gates G1 to Gm has a first input terminal for receiving a signal from the output terminal Q of a corresponding one of the FF circuits #1 to #m, a second input terminal for receiving a common signal outputted from the output terminal /Q of a predetermined FF circuit (in this case, FF circuit #N), and an output terminal for supplying an output signal to the input terminal D of a corresponding one of the FF circuits #2 to #(m+1), which is at the post stage of the corresponding FF circuit. Each of the AND logic gates G1 to Gm computes the AND logic of logic values input to the first and second input terminals and outputs the computation result as an output signal.

A signal outputted from the output terminal /Q of the FF circuit #N at the final stage is supplied to the input terminal #1 of the FF circuit #1 at the first stage.

When it is assumed that values retained by the FF circuits #1 to #5 in the n-th cycle of the clock signal CLK are $X_1(n)$ to $X_N(n)$, respectively, the FF circuits #1 to #N output logical values so as to satisfy the following equations (6) to (8).

$$\text{When } m+1 < k \leq N,\ X_k(n+1) = X_{k-1}(n) \quad (6)$$

$$\text{When } 1 < k \leq m+1,\ X_k(n+1)/X_N(n)*X_{k-1}(n) \quad (7)$$

$$X_1(n+1) = /X_N(n) \quad (8)$$

Figure 14:
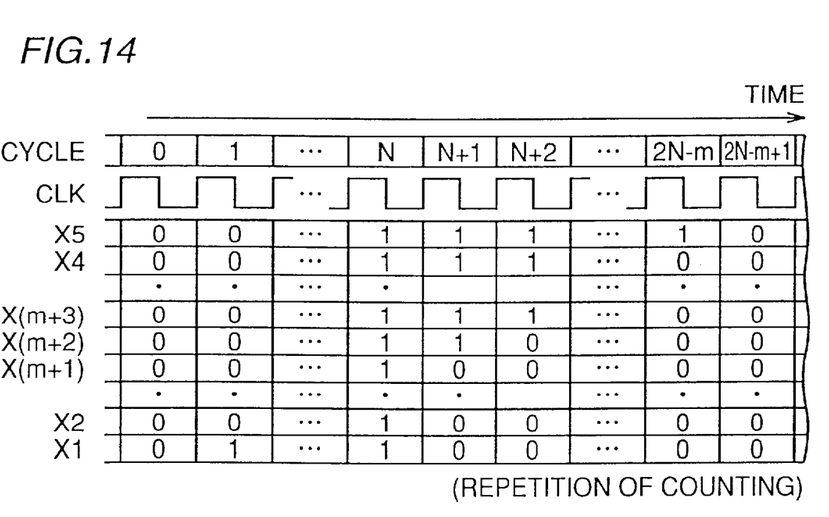
FIG. 14 is a timing chart for explaining the counting operation of the counter circuit shown in FIG. 13.

FIG. 14 is a timing chart showing a state where the counter circuit 10 performs counting operation. It is assumed that all of values X1 to X5 held by the FF circuits #1 to #5 in cycle 0 are zero.

Considering in a manner similar to the first to third embodiments, in cycle N after N cycles since the cycle 0, all of the values $X_1$ to $X_N$ become "1". For the first at this point, the value held by the FF circuit #N at the final stage becomes "1". In the following cycle (N+1), all of the values $X_1$ to $X_{m+1}$ are zero, and all of the remaining values $X_{m+2}$ to $X_N$ are 1. Further, in the cycle (2N−m) after (N−m−1) cycles, the value $X_N$ becomes 1 and all of the other values $X_1$ to $X_{N-1}$ become zero. In the following cycle, all of the values $X_1$ to $X_N$ become zero, and the value returns to the original value in cycle 0. The counter circuit 70 therefore performs the counting operation in (2N−m) cycles, and sequentially outputs (2N−m) kinds of count values as normal values.

When an abnormal value is generated in the counter circuit 70 due to an influence of radiation or the like, at least one of the FF circuits #1 to #N retains zero. For a reason similar to the example of FIG. 3, the value $X_N$ of the FF circuit #N at the final stage becomes 1 in a cycle where the abnormal value is generated or after a few cycles of the cycle.

In the embodiment, N and m have the relation of (N/2) ≤m+1. As long as the relation is satisfied, after (N−m−1) cycles since the cycle in which the FF circuit #N outputs "1", the values $X_1$ to $X_N$ always become the following values.

$X_N = 0$ $X_{N-1} = 0$

. . . , $X_{N-m} = 0$ $X_{N-m-1} = *A_{N-m-2}* \ldots *A_2*A_1$ $X_{N-m-2} = A_{N-m-2}* \ldots *A_2*A_1$

. . . , $X_3 = A_3*A_2*A_1$ $X_2 = A_2 * A_1$
$X_1 = A_1$

Each of $A_1$ to $A_{N-m-1}$ denotes an arbitrary value of 1 or 0. This value coincides with any one of count values outputted in cycles 0 to N shown in FIG. 13. When the relation of $(N/2) \leq m+1$ is satisfied, therefore, even if an abnormal value is generated in the counter circuit 70, the counter circuit 70 always recovers to a normal value by the function of the booby trap.

The case where N=5 and m=2 has been described in the first embodiment, the case where N=5 and m=3 has been described in the second embodiment, and the case where N=7 and m=6 (m=N−1) has been described in the third embodiment.

In FIG. 13, (m) two-input AND logic gates may be replaced with logic gates of another kind. When a Boolean algebra is used, each of the AND logic gates can be changed to a two-input NOR logic gate for calculating the NOR logic between a logic value outputted from the terminal /Q of a corresponding FF circuit and a logic value outputted from the terminal Q of the FF circuit #N and supplying an output signal to the FF circuit at the next stage.

Fifth Embodiment

When (m) increases in the fourth embodiment, the number of logic gates to be simultaneously driven by the FF circuit #N increases. Consequently, the operation of driving the logic gates becomes slow, thereby hindering high-speed operation of the counter circuit. In the fifth embodiment, a counter circuit in which the load of the FF circuit #N can be distributed will be described by using the case where N=7 and m=6 as an example.

Figure 15:
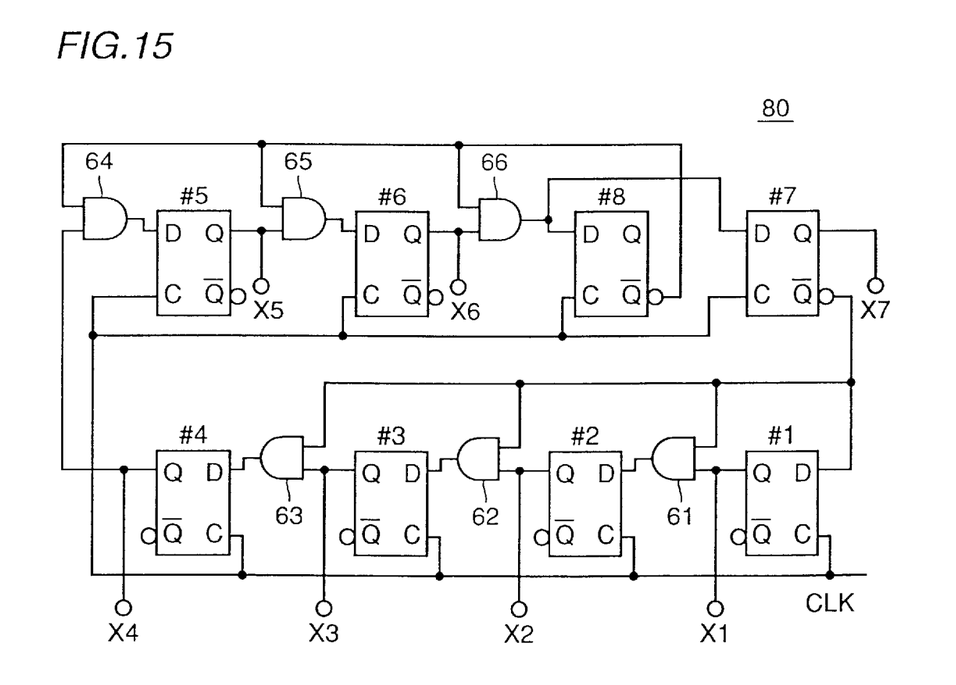
FIG. 15 is a circuit configuration diagram of a counter circuit according to a fifth embodiment of the invention.

FIG. 15 shows the configuration of a counter circuit 80 according to the fifth embodiment. The counter circuit 80 includes, in addition to the components of the counter circuit 60 shown in FIG. 11, an FF circuit #8 (load distribution FF circuit) having an input terminal D connected to the input terminal D of the FF circuit #7 and simultaneously receiving a common logical value. The FF circuit #8 has the same configuration as that of the FF circuit #7 and receives the clock signal CLK by its terminal C. The other input terminals of the AND logic gates 64 to 66 are commonly connected to the terminal Q of the FF circuit #8, not to the FF circuit #7. The other configuration is similar to that of FIG. 11 and its description will not be repeated.

The counting operation of the counter circuit 80 is similar to that of the counter circuit 60 of FIG. 11. In the design as shown in FIG. 11 where a single FF circuit #7 drives all of the AND logic gates, however, a load is applied on the driving capability of the FF circuit #7. In the fifth embodiment, since a load for driving the AND logic gates 61 to 66 is spread into two FF circuits #7 and #8, the operation speed of the AND logic gate improves and it contributes to increase in operational speed of the counter circuit.

The number of the load distribution FF circuit is not limited to one as shown in FIG. 13 but may be more than one. The one or more load distribution FF circuit and the FF circuit #n at the final stage drive different logic gates. The number of two-input logic gates driven by each of the FF circuits in which the load is distributed is not limited to three but one or an arbitrary plural number.

In the counter circuit of the invention in which a plurality of flip flop circuits sequentially connected are provided and the booby trap is provided in correspondence with one or more flip flop circuits out of the plurality of flip flop circuits, by employing the two-input logic gates, a delay of a signal input to the flip flop circuits can be reduced, so that high-speed operation can be realized.

When a plurality of flip flop circuits are set as first to N-th flip flop circuits, at least one two-input logic gate is provided in correspondence with the first to m-th flip flop circuits. By the configuration in which a signal outputted from each of the two-input logic gates is supplied to the second to the (m+1)th flip flop circuits and m is an integer satisfying the relation of $(N/2) \leq m+1$, the counter circuit of which cycles are unconditionally determined can be provided.

The counter circuit is provided with at least one load distribution flip flop circuit for receiving a common clock signal and of which input is connected to the input of a predetermined flip flop circuit, and the flip flop circuits are distributed to drive a plurality of two-input logic gates, thereby enabling the counter circuit to be operated at higher speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A counter circuit for counting a clock signal, comprising a plurality of cascade-connected counter stages for commonly receiving said clock signal, each of said plurality of counter stages including a flip-flop circuit for capturing an input signal in response to said clock signal and outputting an output signal corresponding to said input signal, at least one of said plurality of counter stages being a first arithmetic counter stage, and said first arithmetic counter stage further including a first two-input logic gate for receiving, as a first internal input signal, an output of said flip-flop circuit included in said first arithmetic counter stage receiving, as a second internal input signal, an output of said flip-flop circuit included in a predetermined counter stage different from said first arithmetic counter stage in said plurality of counter stages, and outputting a result of logical operation of said first and second internal input signals to a counter stage at a subsequent stage of said first arithmetic counter stage, wherein said flip-flop circuit includes a first latch circuit having a mode of capturing said input signal received by a first node synchronously with a change from a first logic to a second logic of said clock signal and a mode of holding said input signal captured from said first node synchronously with a change from said second logic to said first logic of said clock signal; and a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

2. A counter circuit for counting a clock signal, comprising a plurality of cascade-connected counter stages for commonly receiving said clock signal, each of said plurality of counter stages including a flip-flop circuit for capturing an input signal in response to said clock signal and outputting an output signal corresponding to said input signal, at least one of said plurality of counter stages being a first arithmetic counter stage, and said first arithmetic counter stage further including a first two-input logic gate for receiving, as a first internal input signal, an output of said flip-flop circuit included in said first arithmetic counter stage, receiving, as a second internal input signal, an output of said flip-flop circuit included in a predetermined counter stage different from said first arithmetic counter stage in said plurality of counter stages, and outputting a result of logical operation of said first and second internal input signals to a counter stage at a subsequent stage of said first arithmetic counter stage, wherein when N is an integer not smaller than two, said plurality of counter stages are first to N-th cascade-connected counter stages in which a counter stage at the first stage is the first counter stage and a counter stage at the final stage is the N-th counter stage, said predetermined counter stage is said N-th counter stage, and when m is an integer satisfying the relation of N/2≦m+1, first to m-th counter stages out of said first to N-th counter stages are said first arithmetic counter stages, wherein said flip-flop circuit includes
- a first latch circuit having a mode of capturing said input signal received by a first node synchronously with a change from a first logic to a second logic of said clock signal and a mode of holding said input signal captured from said first node synchronously with a change from said second logic to said first logic of said clock signal; and
- a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

3. A counter circuit for counting a clock signal, comprising a plurality of cascade-connected counter stages for commonly receiving said clock signal, each of said plurality of counter stages including a flip-flop circuit for capturing an input signal in response to said clock signal and outputting an output signal corresponding to said input signal, at least one of said plurality of counter stages being a first arithmetic counter stage, and said first arithmetic counter stage further including a first two-input logic gate for receiving, as a first internal input signal, an output of said flip-flop circuit included in said first arithmetic counter stage, receiving, as a second internal input signal, an output of said flip-flop circuit included in a predetermined counter stage different from said first arithmetic counter stage in said plurality of counter stages, and outputting a result of logical operation of said first and second internal input signals to a counter stage at a subsequent stage of said first arithmetic counter stage, wherein when N is an integer not smaller than two, said plurality of counter stages are first to N-th cascade-connected counter stages in which a counter stage at the first stage is the first counter stage and a counter stage at the final stage is the N-th counter stage, said predetermined counter stage is said N-th counter stage, and when m is an integer satisfying the relation of N/2≦m+1, first to m-th counter stages out of said first to N-th counter stages are said first arithmetic counter stages, wherein m is equal to N−1.

4. The counter circuit according to claim 3, wherein said flip flop circuit includes
- a first latch circuit having a mode of capturing said input signal received by a first node synchronously with a change from a first logic to a second logic of said clock signal and a mode of holding said input signal captured from said first node synchronously with a change from said second logic to said first logic of said clock signal; and
- a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

5. A counter circuit for counting a clock signal, comprising a plurality of cascade-connected counter stages for commonly receiving said clock signal, each of said plurality of counter stages including a flip-flop circuit for capturing an input signal in response to said clock signal and outputting an output signal corresponding to said input signal, at least one of said plurality of counter stages being a first arithmetic counter stage, and said first arithmetic counter stage further including a first two-input logic gate for receiving, as a first internal input signal, an output of said flip-flop circuit included in said first arithmetic counter stage, receiving, as a second internal input signal, an output of said flip-flop circuit included in a predetermined counter stage different from said first arithmetic counter stage in said plurality of counter stages, and outputting a result of logical operation of said first and second internal input signals to a counter stage at a subsequent stage of said first arithmetic counter stage, wherein said flip-flop circuit outputs a positive polarity output signal and a negative polarity output signal as an inversion signal of said positive polarity output signal, and a counter stage at the final stage in said cascade connection of said plurality of counter stages supplies said negative polarity output signal of said flip-flop circuit included in said counter stage at the final stage as said input signal to be captured to said flip-flop circuit included in a first counter stage of said cascade connection.

6. A counter circuit for counting a clock signal, comprising a plurality of cascade-connected counter stages for commonly receiving said clock signal, each of said plurality of counter stages including a flip-flop circuit for capturing an input signal in response to said clock signal and outputting an output signal corresponding to said input signal, at least one of said plurality of counter stages being a first arithmetic counter stage, and said first arithmetic counter stage further including a first two-input logic gate for receiving, as a first internal input signal, an output of said flip-flop circuit included in said first arithmetic counter stage, receiving, as a second internal input signal, an output of said flip-flop circuit included in a predetermined counter stage different from said first arithmetic counter stage in said plurality of counter stages, and outputting a result of logical operation of said first and second internal input signals to a counter stage at a subsequent stage of said first arithmetic counter stage, said counter circuit further comprising a load distribution circuit for capturing an input signal supplied to said predetermined counter stage in accordance with said clock signal, said load distribution circuit including at least one load distribution flip-flop circuit, receiving said clock signal and having an input commonly connected to an input of said flip-flop circuit included in said predetermined counter stage, at least one of said plurality of counter stages is a second arithmetic counter stage different from said first arithmetic counter stage, and said second arithmetic counter stage further includes a second two-input logic gate for receiving, as a third internal input signal, an output of said flip-flop circuit included in said second arithmetic counter stages, receiving an output of said load distribution circuit as a fourth internal input signal, and outputting a result of logic operation of said third and fourth internal input signals to a counter stage at the next stage of said second arithmetic counter stage.

7. The counter circuit according to claim 6, wherein each of said flip-flop circuits and said load distribution flip-flop circuit includes a first latch circuit having a mode of capturing said input signal received by a first node synchronously with a change from a first logic to a second logic of said clock signal and a mode of holding said input signal captured from said first node synchronously with a change from said second logic to said first logic of said clock signal; and a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

8. The counter circuit according to claim 6 wherein when N is an integer not smaller than two, said plurality of counter stages are first to N-th cascade-connected counter stages in which a counter stage at the first stage is the first counter stage and a counter stage at the final stage is the N-th counter stage, said predetermined counter stage is said N-th counter stage, and when m is an integer satisfying the relation of $N/2 \leq m+1$, each of first to m-th counter stages out of said first to N-th counter stages is either one of said first and second arithmetic counter stages.

9. The counter circuit according to claim 8, wherein each of said flip flop circuit and said load distribution flip flop circuit includes a first latch circuit having a mode of capturing said input signal received by a first node synchronously with a change from a first logic to a second logic of said clock signal and a mode of holding said input signal captured from said first node synchronously with a change from said second logic to said first logic of said clock signal; and a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

10. The counter circuit according to claim 8, wherein m is equal to N-1.

11. The counter circuit according to claim 10, wherein each of said flip flop circuit and said load distribution flip flop circuit includes a first latch circuit having a mode of capturing said input signal received by a first node synchronously with a change from a first logic to a second logic of said clock signal and a mode of holding said input signal captured from said first node synchronously with a change from said second logic to said first logic of said clock signal; and a second latch circuit having a mode of capturing an output of said first latch circuit received by a second node synchronously with a change from said second logic to said first logic of said clock signal and a mode of holding an output of said first latch circuit captured from said second node synchronously with a change from said first logic to said second logic of said clock signal.

* * * * *

UNITED STATES PATENT AND TRADEMARK OFFICE
CERTIFICATE OF CORRECTION

PATENT NO. : 6,661,864 B2
DATED : December 9, 2003
INVENTOR(S) : Masahiko Ishiwaki It is certified that error appears in the above-identified patent and that said Letters Patent is hereby corrected as shown below:

<u>Title page,</u>
Item [73], Assignee, change the first assignee "Mitsubishi Denki Kabushiki Kaisha, Tokyo (JP)" to -- Renesas Technology Corp., Tokyo (JP) --

Signed and Sealed this

Seventh Day of September, 2004

JON W. DUDAS
*Director of the United States Patent and Trademark Office*